United States Patent
Weaver et al.

(10) Patent No.: US 12,054,432 B2
(45) Date of Patent: Aug. 6, 2024

(54) CERAMIC MATRIX COMPOSITE STRUCTURES WITH CONTROLLED MICROSTRUCTURES FABRICATED USING CHEMICAL VAPOR INFILTRATION (CVI)

(71) Applicant: General Electric Company, Schenectady, NY (US)

(72) Inventors: Jared Hogg Weaver, Clifton Park, NY (US); Gregory Scot Corman, Ballston Lake, NY (US); Krishan Lal Luthra, Niskayuna, NY (US)

(73) Assignee: General Electric Company, Cincinnati, OH (US)

( * ) Notice: Subject to any disclaimer, the term of this patent is extended or adjusted under 35 U.S.C. 154(b) by 450 days.

(21) Appl. No.: 17/234,176

(22) Filed: Apr. 19, 2021

(65) Prior Publication Data

US 2021/0238101 A1    Aug. 5, 2021

Related U.S. Application Data

(62) Division of application No. 14/633,422, filed on Feb. 27, 2015, now Pat. No. 11,072,565.

(51) Int. Cl.
| | | |
|---|---|---|
| *C04B 35/71* | (2006.01) | |
| *C04B 35/628* | (2006.01) | |
| *C04B 35/80* | (2006.01) | |
| *C04B 37/00* | (2006.01) | |
| *C23C 16/04* | (2006.01) | |

(52) U.S. Cl.
CPC ........ *C04B 35/71* (2013.01); *C04B 35/62884* (2013.01); *C04B 35/80* (2013.01); *C04B 37/001* (2013.01); *C23C 16/045* (2013.01); *C04B 2235/5208* (2013.01); *C04B 2235/5252* (2013.01); *C04B 2235/614* (2013.01); *C04B 2235/77* (2013.01); *C04B 2235/775* (2013.01); *C04B 2237/38* (2013.01); *C04B 2237/586* (2013.01)

(58) Field of Classification Search
None
See application file for complete search history.

(56) References Cited

U.S. PATENT DOCUMENTS

| | | |
|---|---|---|
| 4,880,441 A | 11/1989 | Kesting et al. |
| 5,264,162 A | 11/1993 | Salem et al. |
| 5,486,379 A | 1/1996 | Bouillon et al. |

(Continued)

FOREIGN PATENT DOCUMENTS

| | | |
|---|---|---|
| CN | 1656042 A | 8/2005 |
| CN | 102471158 A | 5/2012 |

(Continued)

OTHER PUBLICATIONS

First Chinese Office Action & Search corresponding to CN201610328937.0 dated Nov. 7, 2018.

(Continued)

*Primary Examiner* — Chinessa T. Golden
(74) *Attorney, Agent, or Firm* — Dority & Manning, P.A.

(57) ABSTRACT

According to a method set forth herein a plurality of preform plies having first and second preform plies can be associated together to define a preform. The preform can be subject to chemical vapor infiltration (CVI) processing to define a ceramic matrix composite (CMC) structure.

20 Claims, 5 Drawing Sheets

(56) References Cited

U.S. PATENT DOCUMENTS

| | | |
|---|---|---|
| 5,609,912 A | 3/1997 | Lackey et al. |
| 5,628,938 A | 5/1997 | Sangeeta et al. |
| 6,083,560 A | 7/2000 | Fisher et al. |
| 6,280,550 B1 | 8/2001 | Steibel et al. |
| 6,350,713 B1 | 2/2002 | Petrak |
| 6,372,072 B1 | 4/2002 | Healey |
| 6,472,058 B2 * | 10/2002 | Hanzawa .............. F16D 69/023 428/294.1 |
| 6,723,382 B2 | 4/2004 | Yamaguchi et al. |
| 6,733,907 B2 | 5/2004 | Morrison et al. |
| 7,247,212 B2 | 7/2007 | Kostar et al. |
| 7,306,826 B2 | 12/2007 | Subramanian et al. |
| 7,378,362 B2 | 5/2008 | Nixon et al. |
| 7,507,466 B2 | 3/2009 | Steibel et al. |
| 7,549,840 B2 | 6/2009 | Subramanian et al. |
| 7,597,838 B2 | 10/2009 | Subramanian et al. |
| 7,754,126 B2 | 7/2010 | Subramanian et al. |
| 8,114,799 B2 | 2/2012 | Subramanian et al. |
| 8,426,326 B2 | 4/2013 | Bouillon et al. |
| 8,529,995 B2 | 9/2013 | Eberling-Fux et al. |
| 9,022,733 B2 | 5/2015 | Coupe et al. |
| 2003/0138672 A1 | 7/2003 | Bauer et al. |
| 2004/0067316 A1 | 4/2004 | Gray et al. |
| 2005/0163988 A1 | 7/2005 | Ebert et al. |
| 2005/0186069 A1* | 8/2005 | Subramanian .......... F01D 5/284 415/200 |
| 2006/0035024 A1 | 2/2006 | Landini et al. |
| 2009/0149308 A1 | 6/2009 | Kienzle et al. |
| 2010/0021713 A1 | 1/2010 | Lane et al. |
| 2010/0084075 A1 | 4/2010 | Rutten et al. |
| 2010/0086679 A1 | 4/2010 | Jehl et al. |
| 2012/0085811 A1 | 4/2012 | Warke et al. |
| 2013/0004325 A1 | 1/2013 | McCaffrey et al. |

FOREIGN PATENT DOCUMENTS

| | | |
|---|---|---|
| CN | 103113123 A | 5/2013 |
| CN | 103909691 A | 7/2014 |
| EP | 0452275 A1 | 10/1991 |
| EP | 1593757 A1 | 11/2005 |
| JP | 2006124273 A | 5/2006 |
| TW | 200604134 A | 2/2006 |
| WO | WO2008141201 A1 | 11/2008 |

OTHER PUBLICATIONS

European Search Report Corresponding to EP16157165.8 on Jul. 22, 2016.

Japanese Notification for Refusal Issued corresponding to JP2016031547 on May 9, 2017.

Japanese Notification of Reasons for Refusal corresponding to JP2016031547 dated Jan. 30, 2018.

Angelova, Determination of the Pors Size of Woven Structures Through Image Analysis, Cent. Eur. J. Eng vol. 2, Issue 1, 2013, pp. 129-135.

Qizhong et al., "Preparation, Structure and Application of High-Performance Carbon Composites", Central South University Press, Dec. 2010, pp. 35-36.

\* cited by examiner

CERAMIC MATRIX COMPOSITE STRUCTURES WITH CONTROLLED MICROSTRUCTURES FABRICATED USING CHEMICAL VAPOR INFILTRATION (CVI)

CROSS-REFERENCE TO RELATED APPLICATION

This application is a divisional of U.S. application Ser. No. 14/633,422, filed on Feb. 27, 2015, titled "CERAMIC MATRIX COMPOSITE STRUCTURES WITH CONTROLLED MICROSTRUCTURES FABRICATED USING CHEMICAL VAPOR INFILTRATION (CVI)", which is hereby expressly incorporated herein by reference in its entirety.

The present disclosure relates to laminate structures generally and particularly to laminate structure fabricated using chemical vapor infiltration.

BACKGROUND

For fabrication of ceramic matrix composite (CMC) structures using chemical vapor infiltration (CVI) a preform can be provided. A preform can include fibers which can be, e.g., unidirectional or woven. In one form the fibers can be ceramic based and can be formed of SiC. Within the reaction chamber at an elevated temperature the preform can be exposed to certain gasses. On being exposed to the certain gasses at an elevated temperature, a reaction can occur and solid material termed matrix can be deposited on fibers of the preform.

Ceramic matrix composites (CMCs) made using chemical vapor infiltration (CVI) can potentially be used at temperatures of up to and greater than 2700 deg. F. One of the key limitations of a CVI CMC structure is that the structure can contain significant porosity (e.g., up to 15% and more) which is typically greatest in the center of the CMC structure and which can increase with an increasing thickness of the preform. The porosity can increase with thickness and can significantly impact both the in-plane and inter-laminar properties and overall oxidation resistance of the composite.

BRIEF DESCRIPTION

According to a method set forth herein a plurality of preform plies having first and second preform plies can be associated together to define a preform. The preform can be subject to chemical vapor infiltration processing (CVI) to define a ceramic matrix composite (CMC) structure.

DETAILED DESCRIPTION

According to a method set forth herein a plurality of preform plies having first and second preform plies can be associated together to define a preform. The preform can be subject to chemical vapor infiltration (CVI) processing to define a ceramic matrix composite (CMC) structure.

According to a method set forth herein a plurality of preform plies having first and second preform plies that include different average pore sizes can be associated together to define a preform. The preform can be subject to CVI to define a CMC structure.

According to a method set forth herein a plurality of preform plies having first and second preform plies can be associated together to define a preform. One or more of the first preform ply or the second preform ply can include unidirectional fibers. The preform can be subject to CVI to define a CMC structure.

According to a method set forth herein a plurality of preform plies having first and second preform plies can be associated together to define a preform. A process for fabricating a preform ply can include using a pore former. The preform can be subject to CVI to define a CMC structure.

According to a method set forth herein a plurality of preform plies having first and second preform plies can be associated together to define a preform. A process for fabricating a preform ply can include using a filler. The preform can be subject to CVI to define a CMC structure.

Figure 1:
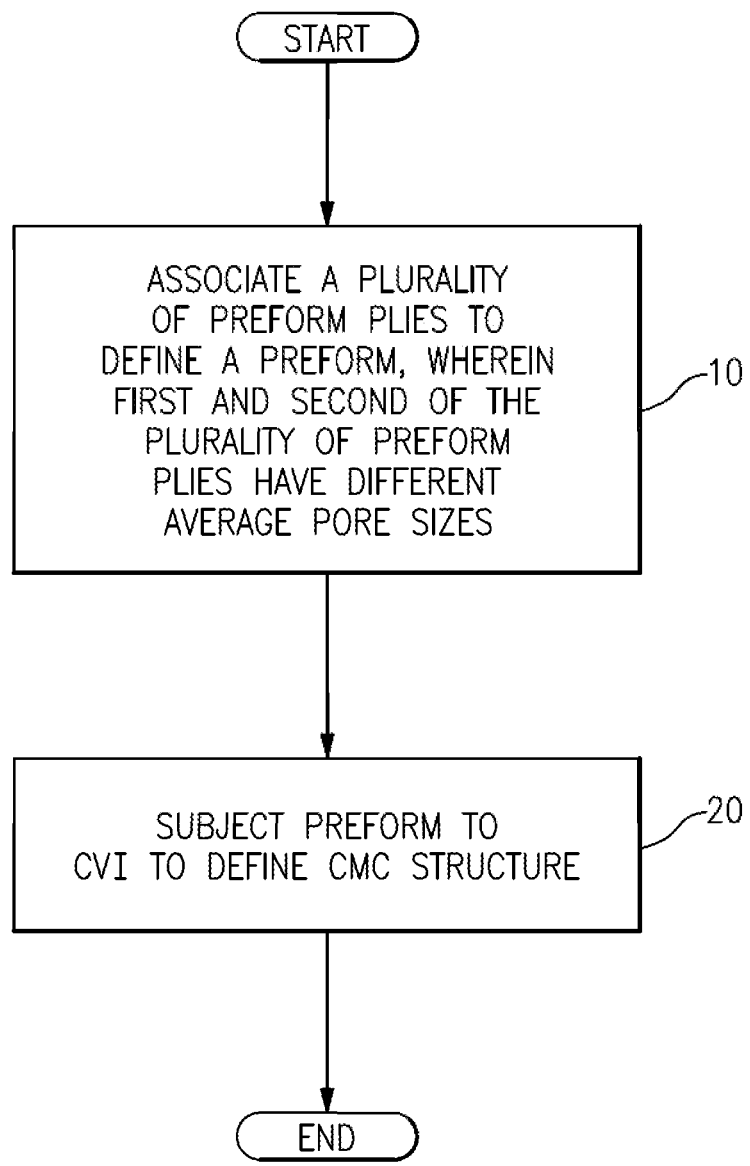
FIG. 1 is a flow diagram illustrating fabrication of a laminate structure.

Referring to FIG. 1, there is set forth a method for fabricating a laminate structure having a plurality of layer structures in one embodiment. At block 10 a plurality of preform plies having first and second preform plies that include different average pore sizes can be associated together to define a preform. At block 20 the preform can be subject to chemical vapor infiltration processing (CVI) to define a ceramic matrix composite (CMC) structure. Various illustrative examples are set forth herein to illustrate features and advantages of the disclosed method.

Figure 3:
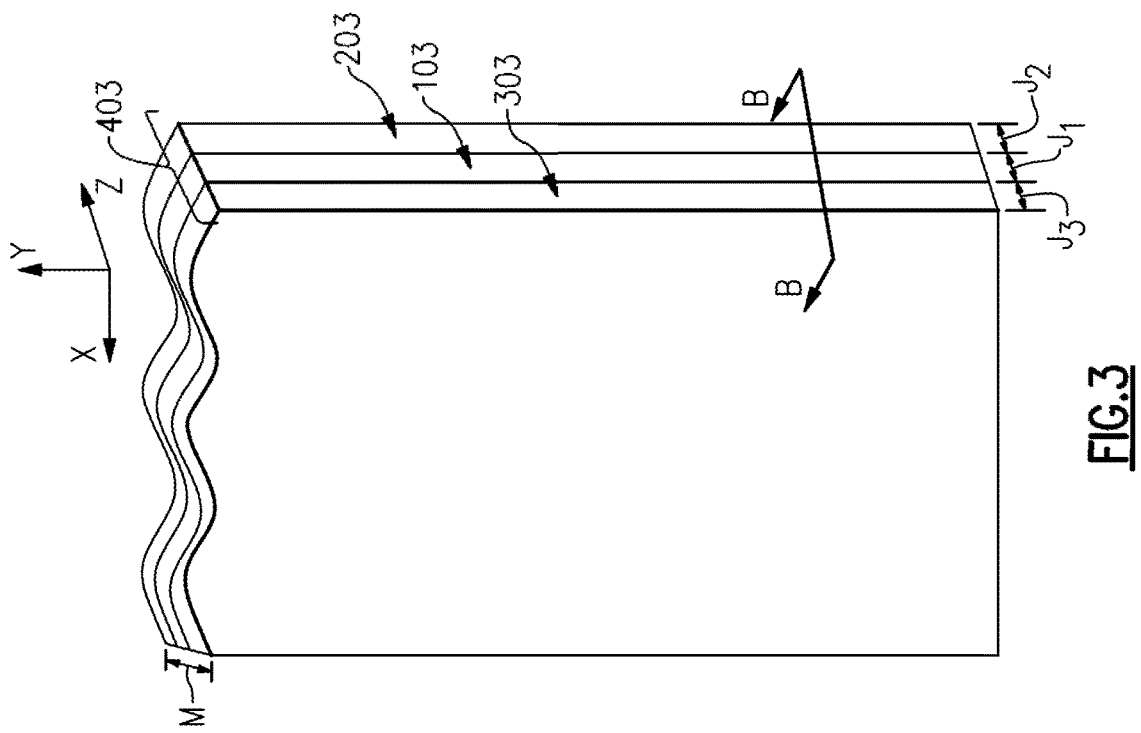
FIG. 3 is a perspective view of a CMC structure having a plurality of CMC ply structures.
Figure 2:
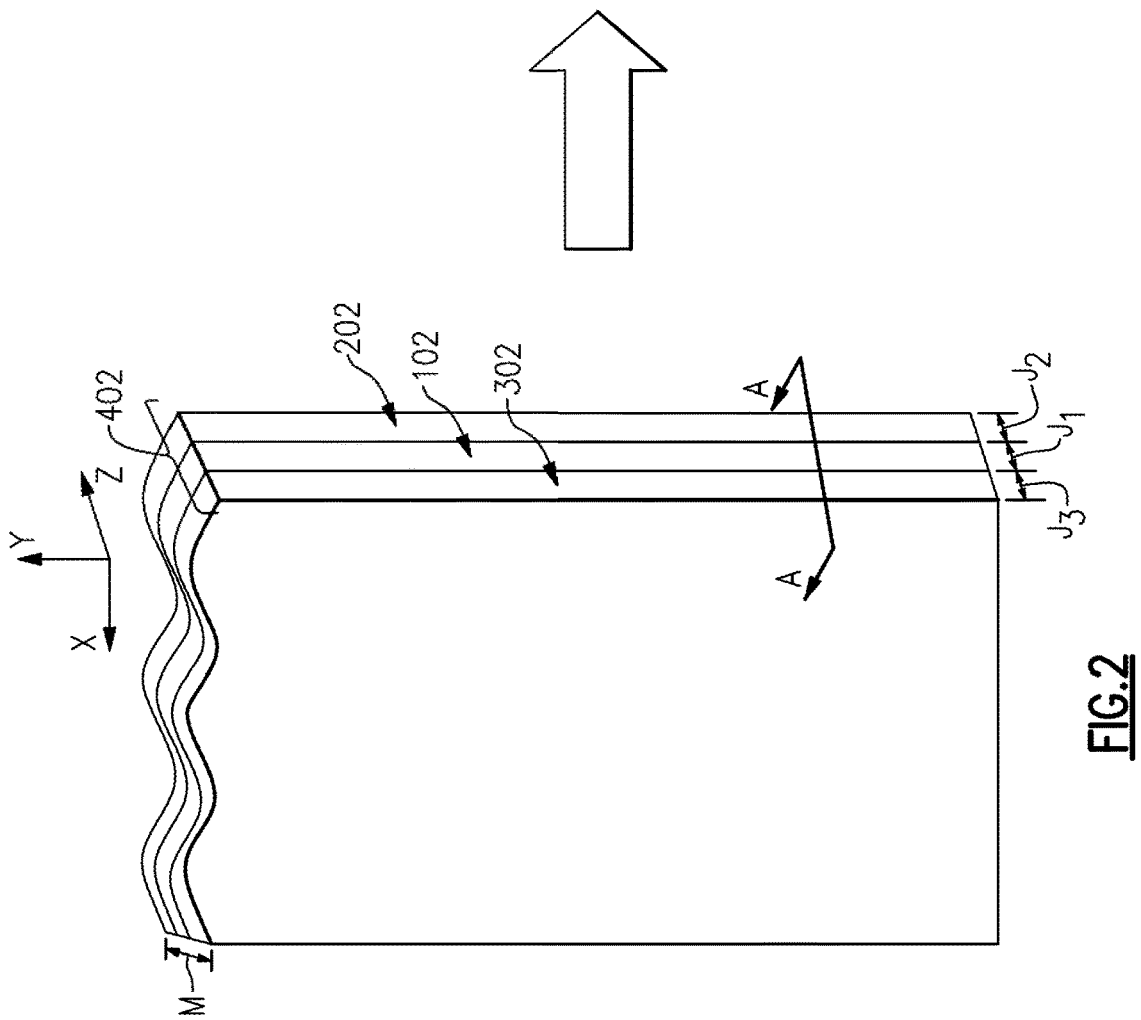
FIG. 2 is a perspective view illustrating a preform having a plurality of preform plies.

Additional features of the method of FIG. 1 in one embodiment are described with reference to FIGS. 2 through 5. At block 10 a plurality of preform plies 102, 202, 302 as shown in FIG. 2 having first and second preform plies with first and second different average pore sizes can be associated together to define a preform 402. Preform 402 can have a thickness M, and the preform plies 102, 202, 302, can have the thickness of about $J_1$, $J_2$, $J_3$ respectively. At block 20 preform 402 can be subject to CVI. On being subject to CVI, a densified CMC structure 403 as shown in FIG. 3 can be defined having densified CMC ply structure 103 densified CMC ply structure 203 and densified CMC ply structure 303. Densified CMC structure 403 can have a thickness of about M, while individual structures 103, 203, and 303 can have thicknesses of about $J_1$, $J_2$, $J_3$ respectively.

Figure 4:
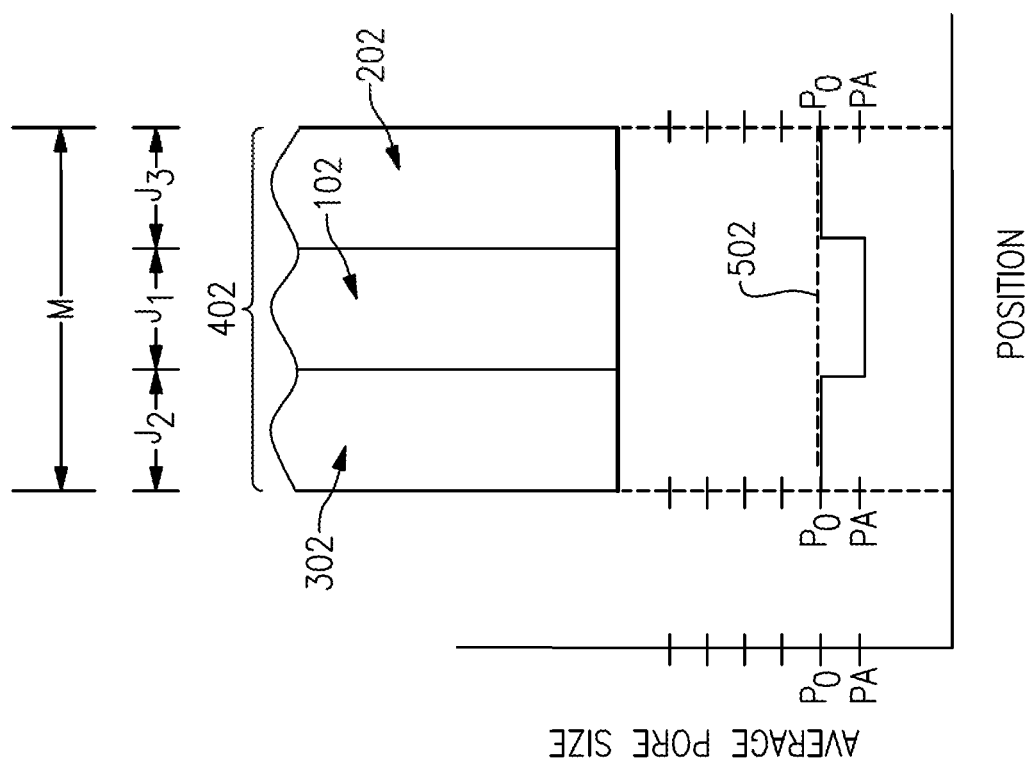
FIG. 4 is a cross sectional view taken along line A-A of the preform structure shown in FIG. 2 with a pore size profile for the preform structure.

Referring to FIG. 4 an upper portion of FIG. 4 is a cross sectional view taken along line A-A of FIG. 2. A lower portion of FIG. 4 illustrates an average pore size profile through a thickness of preform 402. In the embodiment of FIG. 2 preform 402 includes center ply 102 and outer plies 203, 302. As shown in FIG. 4, preform plies 202 and 203 can have the average pore size of $P_O$, and preform ply 102 can have the average pore size of $P_A$, $P_A < P_O$. In one embodiment, preform plies 202 and 203 can have a first uniform density throughout respective thicknesses thereof, and preform ply 102 can have a uniform density of greater than the first uniform density.

Figure 5:
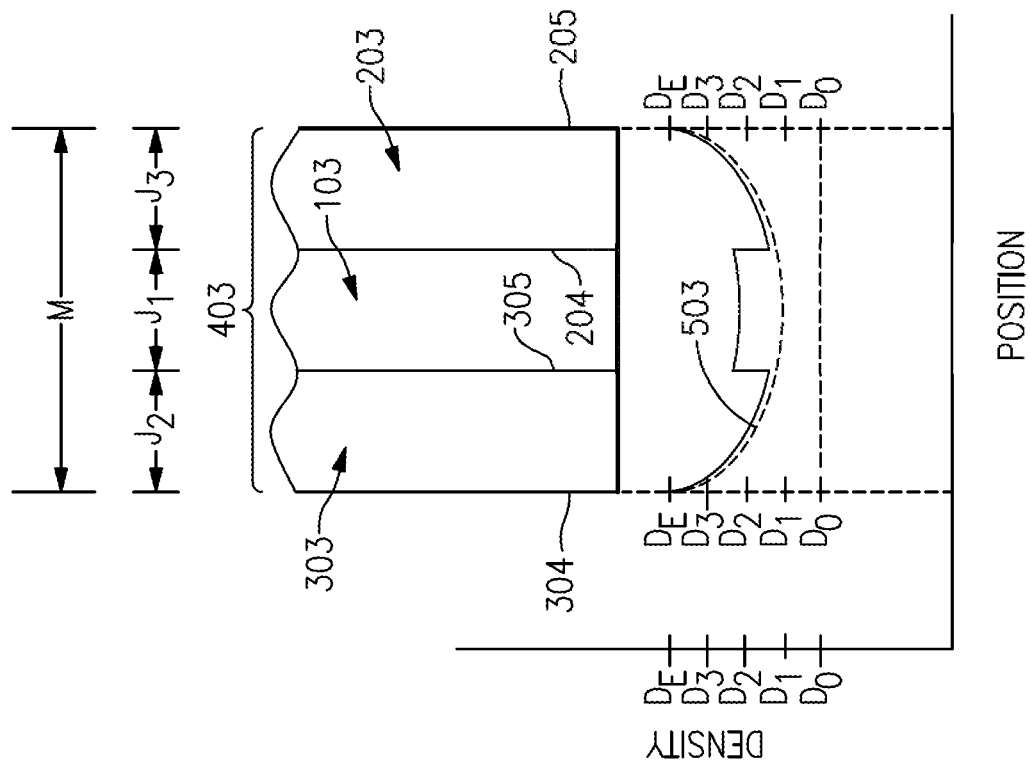
FIG. 5 is a cross sectional view taken along line B-B of the CMC structure shown in FIG. 3 with a density profile for the CMC structure.

Referring to FIG. 5, an upper portion of FIG. 5 is a cross sectional view taken along line B-B of FIG. 3 showing a densified structure 403 defined by subjecting preform 402 as shown in FIG. 2 to CVI. A lower portion of FIG. 5 is a density profile through a thickness of CMC structure 403. Referring to FIG. 5, CMC structure 403 can have a U shaped density profile through a thickness of center CMC ply structure 103 and can have ramp shaped density profiles through outer ply CMC structures 203 and 303. CMC ply structures 203 and 303 can have a generally increasing density from surface 305 to surface 304 and CMC ply structure 203 and can have a generally increasing density from surface 204 to surface 205. On being subject to CVI sections of CMC structure 403 toward outer surfaces 304 and 205 can become densified more rapidly than sections of CMC structure 403 spaced apart from outer surfaces. During performance of CVI, pores toward outer surfaces 304 and 205 tend to close thus limiting an extent of densification that can occur at sections of CMC structure 403 spaced apart from surfaces 304 and 205.

In one aspect as set forth in reference to block 10, an average pore size of a first preform ply, e.g., preform ply 102 can be different from the average pore size of a second preform ply, e.g., preform ply 202.

Advantages of the method of FIG. 1 are set forth with reference to dashed line 502 (FIG. 4) illustrating an average pore size profile of preform 402 in an alternative embodiment and with reference to dashed line 503 (FIG. 5) illustrating a density profile of CMC structure 403 in an alternative embodiment. In an alternative embodiment of preform 402 each of preform plies 102, 202, 302 can have a common average pore size profile wherein an average pore size profile of each of the preform plies 102, 202, 302 can have the average pore size, $P_0$. Dashed line 502 represents the average pore size profile of a preform 402 wherein each of preform ply 102, preform ply 202, and preform ply 302 has a common average pore size profile characterized by having the average pore size, $P_0$.

Referring to FIG. 5, dashed line 503 represents a density profile of CMC structure 403 in the case preform 402 has an average pore size profile according to dashed line 502 (FIG. 4). Comparing the density profile of dashed line 503 to the density profile indicated by FIG. 5 it is seen that the method set forth in reference to FIG. 1 can increase a uniformity of a density of CMC structure 403. Providing a preform 402 for subjecting to CVI having first and second plies that include different average pore size profiles can result in a CMC structure 403 having a more uniform density. In the particular example of FIG. 4 and FIG. 5, each of outer surface preform plies 202 and 302 can have a higher average pore size than center preform ply 102. In one embodiment, providing outer surface preform plies to include larger average pore sizes provides for improved densification of a center section of a preform having a plurality of preform plies. In one particular embodiment, preform ply 102, preform ply 202, and preform ply 302 can be of common construction. In such embodiment preform plies can have common densities as well as common average pore size profiles. An example density profile for a preform 402 wherein preform plies 102, 202, 302 are of common construction is given by the horizontal line representing the continuous density Do as shown in FIG. 5.

In one embodiment, a CMC structure having a more uniform density can be characterized by having a smaller difference between a maximum density and a minimum density through a thickness of the CMC structure than a CMC structure having a less uniform density. In one embodiment, a CMC structure having a more uniform density can be characterized by having a smaller standard deviation of densities through a thickness of CMC structure than a CMC structure having a less uniform density. The density profile represented in FIG. 5 can be characterized by having a smaller maximum to minimum density difference and a smaller standard deviation of densities that the density profile represented by dashed line 503.

Figure 6:
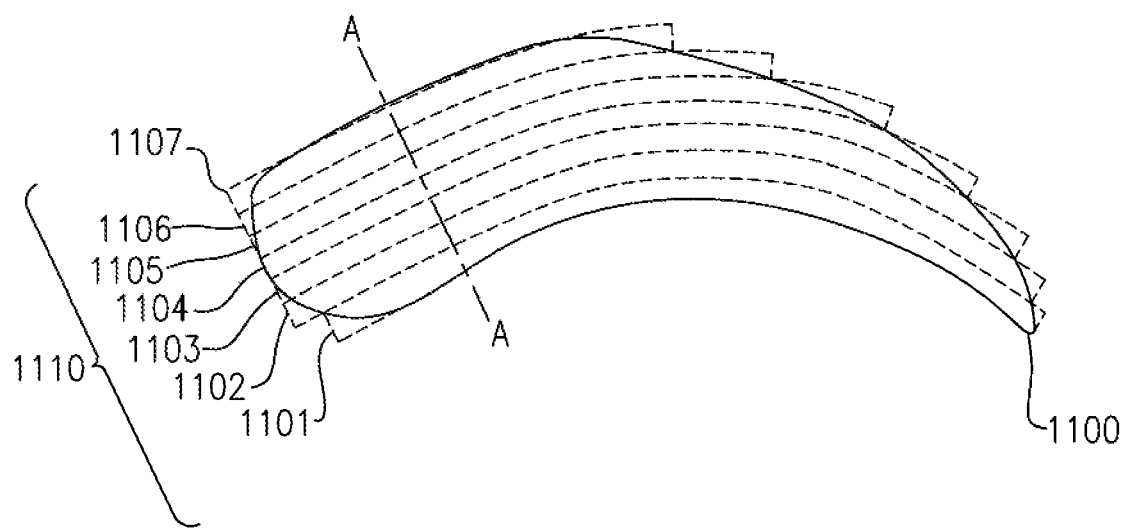
FIG. 6 is a side cross sectional view illustrating a method of fabricating a CMC structure having a specified shape.

Referring to FIG. 1 and FIG. 6, the method set forth in reference to FIG. 1 can be used for fabrication of a CMC structure having a specified shape, e.g., shape 1100 as shown in FIG. 6. In one embodiment, the structure can be a component of a turbine having a specified shape. A component herein can refer to a section of component. Referring to FIG. 6 in one example a plurality of preform plies 1110 at locations 1101, 1102, 1103, 1104, 1105, 1106 and 1107 can be associated together at block 10 to define a preform and can be shaped into a shape substantially corresponding to shape 1100. At block 20 the plurality of preform plies 1110 can be subject to CVI to densify and rigidize the plurality of preform plies 1110. Material outside of the boundary of shape 1100 can be removed using machining processes.

Shape 1100 referred to in FIG. 6 can be a shape defining a turbine component, e.g., a combustion liner, vane, blade, nozzle, bucket, transition piece, turbine center frame, or a shroud. While shape 1100 in the example of FIG. 6 is shown as a solid, un-hollowed shape 1100, shape 1100 in another example can be provided by a hollowed shape. Vapor can infiltrate a preform for performance of CVI through an outer surface of the preform in the where shape 1100 is a solid un-hollowed shape and where the outer surface is exposed to an atmosphere within a CVI treatment chamber reactor. Vapor can infiltrate a preform for performance of CVI through an outer surface of a preform where shape 1100 is a hollowed shape and where the outer surface is exposed to an atmosphere within a CVI treatment chamber reactor but the inner surface is not exposed to an atmosphere within a CVI treatment chamber reactor. Vapor can infiltrate a preform for performance of CVI through an outer surface and through an inner surface of the preform where shape 1100 is a hollowed shape and where the outer surface and the inner surface are exposed to an atmosphere within a CVI treatment chamber reactor.

Figure 7:
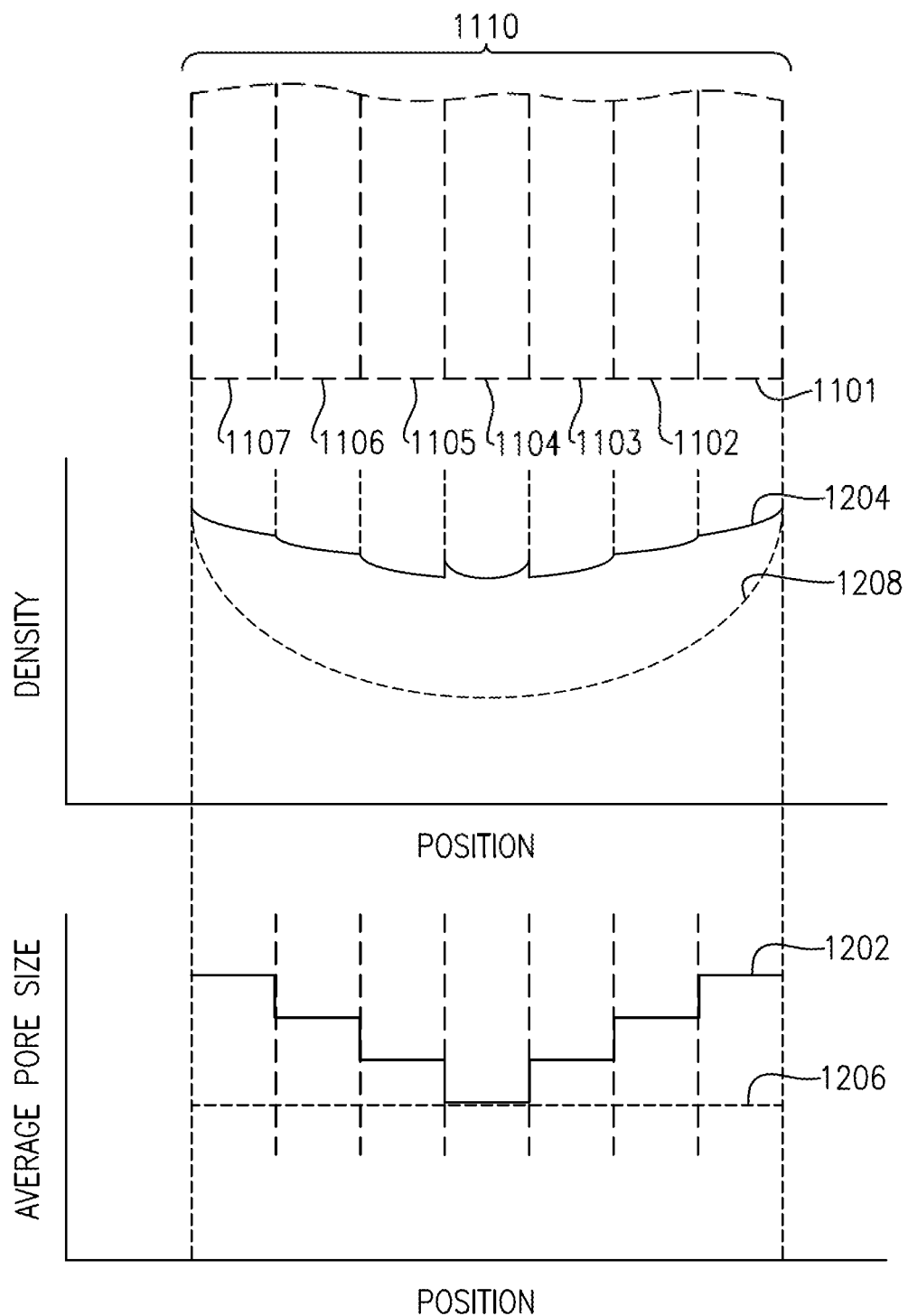
FIG. 7 is a cross sectional view taken along line A-A of FIG. 6 with a density profile for a pore size profile for a structure of the cross sectional view.

Referring to FIG. 7, a top portion of FIG. 7 is a cross sectional view taken along line A-A of FIG. 6. A bottom portion of FIG. 7 is an average pore size profile of structures in a preform ply stage through the locations 1101, 1102, 1103, 1104, 1105, 1106, and 1107. A center portion of FIG. 7 is a density profile of structures through the locations 1101, 1102, 1103, 1104, 1105, 1106 and 1107. Referring to FIG. 7 plot 1202 is the set of average pore sizes through locations 1101, 1102, 1103, 1104, 1105, 1106 and 1107 when structures at the locations 1101, 1102, 1103, 1104, 1105, 1106 and 1107 are in a preform ply stage. Referring to plot 1202 preform plies can be provided so that one or more center preform plies have smaller average pore sizes than outer surface preform plies. Plot 1204 is the set of densities of structures at locations 1101, 1102, 1103, 1104, 1105, 1106 and 1107 when structures at locations 1101, 1102, 1103, 1104, 1105, 1106 and 1107 are in a densified CMC stage.

Referring further to FIG. 7, plot 1206 is the set of average pore sizes through locations 1101, 1102, 1103, 1104, 1105, 1106 and 1107 in an alternative embodiment wherein structures at locations 1101, 1102, 1103, 1104, 1105, 1106 and 1107 are in a preform ply stage and wherein the preform ply at each of the locations 1101, 1102, 1103, 1104, 1105, 1106 and 1107 has a substantially common average pore size. Plot 1208 represents the set of densities through locations 1101, 1102, 1103, 1104, 1105, 1106 and 1107 after structures at locations 1101, 1102, 1103, 1104, 1105, 1106 and 1107 having an average pore size profile indicated by plot 1206 are subject to CVI and in a densified CMC stage.

Comparing plot 1204 to plot 1208 it is seen that providing one or more center preform ply to have a smaller average pore size than one or more outer surface preform ply can result in a densified CMC structure having a more uniform density that a density of a fabricated CMC structure in the case that each preform ply has a common average pore size profile.

There is set forth in reference, e.g., to FIG. 4 a preform having a plurality of preform plies, wherein the plurality of preform plies includes a first preform ply 102 a second preform ply 202 and a third preform ply 302, wherein the second preform ply 202 is disposed at a first side of the preform ply 102, wherein the third preform ply 302 is disposed at a second side of the preform ply 102, and wherein the second preform ply 202 and the third preform ply 302 each have larger average pore size than an average pore size of the first preform ply 102.

There is set forth in reference, e.g., to FIG. 6 a preform having a plurality of preform plies, wherein the plurality of preform plies includes a first preform ply, e.g., at location 1104, a second preform ply, e.g., at location 1101 and a third preform ply, e.g., at location 1107, wherein the second preform ply is disposed at a first side of the first preform ply, wherein the third preform ply is disposed at a second side of the preform ply, and wherein the second preform ply and the third preform ply each have larger average pore size than an average pore size of the first preform ply, e.g., at location 1104.

FIG. 7 illustrates one embodiment of a representative average pore size profile for a preform where a preform having shape 1110 is a solid structure and where an outer surface of the solid structure defined by the right and left sides respectively of the preform ply at location 1101 and location 1107 are exposed to an atmosphere within a CVI treatment chamber reactor. In the embodiment of FIG. 7 a ply at a center location can have a relatively small average pore size and pore sizes of plies at locations from the center progressively outward toward first and second exposed outer surfaces (at the left side of location 1107 and the right side of location 1101) can have progressively larger average pore sizes. In such embodiment, vapor infiltration in larger volumes for longer durations and to longer distances from the exposed outer surfaces (at the left side of location 1107 and the right side of location 1101) can be encouraged to result in a CMC structure having increased density uniformity.

In one example of such embodiment the ply at each of the various locations 1101 through 1107 can have pores of substantially uniform size with each ply having a different average pore size relative to the remaining plies.

Where shape 1110 as represented in FIG. 7 is a sidewall of a hollow structure preform and where the preform ply at the right side of location 1101 defines an outer surface of the hollow structure preform exposed to the atmosphere within a CVI reaction chamber, and where the preform ply at the left side of location 1107 defines an inner surface of an overall hollow structure preform that is not exposed to an atmosphere within a CVI reaction chamber the preform can advantageously have an average pore size profile characterized by a relatively small average pore size for the preform ply at location 1107 and an increasing average pore sizes through the various plies at the locations 1107 through 1101 advancing left to right. A hollowed preform as set forth herein in one embodiment can be a sealed hollowed preform. Preform plies from a location 1104 of a center preform ply to a preform ply at location 1101 defining an outer surface can have increasing average pore sizes. Preform plies from a location 1104 of a center preform ply to a preform ply at location 1107 defining an inner surface of a hollowed structure preform can have decreasing average pore sizes. In such embodiment, vapor infiltration in larger volumes for longer durations and to longer distances from the exposed outer surface (at the right side of location 1101) can be encouraged to result in a CMC structure having increased density uniformity. In one example of such embodiment the ply at each of the various locations 1101 through 1107 can have pores of substantially uniform size with each ply having a different average pore size relative to the remaining plies.

Although the number of locations having plies in the exemplary embodiment of FIG. 6 and FIG. 7 is a certain number, the number of locations having plies in an actual turbine component can be less than or greater than the certain number, e.g. any integer number. In one embodiment, the number of preform plies can be e.g. more than 1, more than 3, more than 5, more than 10, more than 20, more than 50, more than 100. As set forth herein, where a preform defined by the plurality of preform plies is a solid structure the preform can include a center preform ply, a first set of preform plies from the center perform ply to a preform ply defining a first outer surface of the preform having increasing average pore sizes, and a second set of preform plies from the center perform ply to a preform ply defining a second outer surface of the preform having increasing average pore sizes. In one example each preform ply of the preform can have pores of substantially uniform size. As set forth herein, where a preform defined by the plurality of preform plies is a solid structure a center preform ply of the plurality of preform plies e.g. at location 1104 of FIG. 7 can have a smallest average pore size of the plurality of preform plies, and preform plies at successive locations from a location of the center preform ply to a location of a preform ply defining an outer surface of the preform can have increasing average pore sizes. In one example each preform ply of the preform can have pores of substantially uniform size. As set forth herein, where a preform has an overall hollow structure and where a plurality of preform plies of the preform define a sidewall of the hollow structure preform the preform can include a center preform ply, e.g. at location 1104 of FIG. 7, a first set of preform plies from the center perform ply to a preform ply defining an outer surface of the hollow structure preform having increasing average pore sizes, and a second set of preform plies from the center perform ply to a preform ply defining an inner surface of the hollow structure preform having decreasing average pore sizes. In one example each preform ply of the preform can have pores of substantially uniform size. As set forth herein, wherein the preform is a hollow structure preform, wherein the plurality of preform plies of the preform define a sidewall of the hollow structure preform, a certain preform ply of the plurality of preform plies e.g. the ply at location 1107 as shown in FIG. 7 can define an inner surface of the hollow structure preform can have a smallest average pore size of the plurality of preform plies, and preform plies of the plurality of preform plies in a succession of locations from a location of the certain preform ply to a location of a preform ply that defines an outer surface of the hollow structure preform can have increasing average pore sizes. In one example each preform ply of the preform can have pores of substantially uniform size.

Regarding preform plies for use with method of FIG. 1, preform plies (e.g., plies 102, 202, 302, plies at locations 1101-1107) in one embodiment can include unidirectional fibers (tows). Regarding preform plies, preform plies in one embodiment can include woven fibers. The fibers can be provided by ceramic fibers. Ceramic fibers of preform plies as set forth herein can have a polycrystalline structure in one embodiment. In one embodiment, ceramic fibers of preform plies as set forth herein can include a non-stoichiometric chemical composition. In one embodiment, ceramic fibers of preform plies as set forth herein can include a stoichiometric chemical composition. In one embodiment, ceramic fibers of preform plies as set forth herein can include an inhomogeneous chemical composition. In one embodiment ceramic fibers of preform plies as set forth herein can be provided by single crystal fibers. In one embodiment, ceramic fibers of preform plies as set forth herein can be provided by amorphous fibers. In one embodiment, ceramic fibers of preform plies as set forth herein can be provided by silicon carbide (SiC) fibers. In one embodiment, ceramic fibers of preform plies as set forth herein can be provided by polycrystalline SiC fibers. Preform plies as set forth herein can include a binder material that allows the preform to be shaped to a desired shape prior to being subject to CVI. Ceramic fibers of preform plies as set forth herein can be provided to be stable at temperatures of over 1000 deg. C.

In one embodiment, ceramic fibers of preform plies as set forth herein can be absent of fiber coating. In one embodiment, ceramic fibers of preform plies as set forth herein can include a coating. Such fiber coating can be intrinsic to a fiber or can be previously deposited, e.g., deposited via CVI or by another process. A coating for a fiber can be deposited on fibers before making the preform or can be deposited as part of making the preform.

Preform plies, e.g., as shown in FIG. 2 or FIG. 6 described as being associated together can be associated by being laid up and can be held in position in relation to one another in one embodiment with use or forces provided by a binder included in respective associated preform plies.

The porosity of preform plies as set forth herein in an unprocessed stage herein may vary. In one embodiment, preform plies as set forth herein can each have a substantially uniform porosity (e.g., $1-D_0$) in an unprocessed stage prior to being subject to CVI of between about 20% to about 90% and accordingly a density of between about 80% to about 10%. In a more particular embodiment, preforms 202, 302, 502, 602, 702 can have a porosity of between about 40% to about 70% and accordingly a density of between about 70% to about 40%. Preform plies as set forth herein can be provided herein to include common material and structural characteristics, including common fiber material characteristics and porosity characteristics.

For performance of CVI processing at block 20, a preform, e.g., preform 402 or the preform at the set of locations 1110 can be introduced into a CVI treatment chamber reactor and an appropriate gas can be infiltrated through the preform. The preform can provide a reinforcement for a ceramic matrix composite (CMC) formed by subjecting a preform to CVI. An appropriate gas can include, e.g., any one of, or a mixture of two or more of, hydrogen, methyltrichlorosilane, boron trichloride, ammonia, trichlorosilane, and a hydrocarbon gas. An appropriate gas can include, e.g., any silane containing vapor as well as any siloxane, silazane, or other silicon containing vapor. The gas within the CVI treatment chamber reactor can be absent of a primary flow direction. Providing a gas within a chamber reactor to be absent of a primary flow direction can reduce processing cost. The temperature within the chamber can be raised, and the reactant gases can undergo a chemical reaction at high temperature. During a reaction a matrix coating can be formed on surfaces of fibers of a preform, e.g., preform 402 or the preform at the set of locations 1110 to define a densified CMC structure, e.g., densified CMC structure 403 or the densified structure at the set of locations 1110. Where fibers of a preform as set forth herein are provided by an SiC fiber a matrix consisting of, e.g., SiC, BN, $B_4C$, $Si_3N_4$, $MoSi_2$, $SiO_2$, SiOC, SiNC, and/or SiONC can be formed on fibers of the preform to define a densified CMC structure, e.g., CMC structure 403 of the CMC structure at the set of locations 1110 as set forth herein. During performance or CVI processing in one embodiment a coating can be formed on fibers of a preform ply as set forth herein prior to formation or matrix.

Reference is now made to fabrication of preform plies as set forth herein and to control of average pore size of such preform plies.

For fabrication of a preform ply as set forth herein a slurry can be prepared by combining a binder, carrier, fillers, and pore formers. The slurry can be roll milled to deagglomerate and disperse the powders. A fiber tow (in one embodiment a single bundle of about –500 individual fibers) can be prepared by coating fibers of the tow with boron nitride (BN). The slurry can be infiltrated into the coated tow by passing the tow through a bath of the slurry. The tow can then be wound onto a drum such that a tape is formed. The tape can be removed from the drum and unidirectional preform plies can be cut from the tape. Fabrication of a preform ply having woven bidirectional fibers or another form of multidirectional fibers can include forcing the slurry into the woven bidirectional fibers or other form of multidirectional fibers.

The preform plies can be laid-up into a desired pattern, e.g., of shape 1100 (FIG. 6) and the layup can be consolidated in a vacuum bag or other process (e.g., autoclave). The consolidated layup can then pyrolyzed in an inert atmosphere where the binder is converted from a polymer into a ceramic and where the pore former is volatilized. Pyrolysis can include, e.g., firing in air, in a vacuum, under inert atmosphere, or under a reactive atmosphere. A preform can thus be fabricated that can be suitable for CVI densification.

Regarding a binder as set forth herein a binder can include organic or inorganic material that leaves char/residue after a pyrolysis or firing. Binder as set forth herein can function to hold fibers together as a preform. Examples of binder include TEOS, polycarbosilanes, polysilazanes, polysiloxanes, phenolics, and furanic compounds.

Regarding a carrier as set forth herein a carrier can include organic or inorganic liquid that dissolves or carries the binder and other ingredients. Examples of a carrier include water, isopropanol, toluene, and acetone.

Regarding a filler as set forth herein a filler can include an oxide or non-oxide particle or whisker that helps control shrinkage of the binder and resulting pore formation during pyrolysis. Examples of a filler include SiC, $B_4C$, $SiO_2$, HfC, $HfB_2$, $Si_3N_4$, and $Al_2O_3$.

Regarding a pore former as set forth herein a pore former can include a particle or other species that can remain present through a consolidation process but can be fugitive in the pyrolysis process resulting in a pore. Examples of a pore former can comprise polyethylene, polypropylene, polyamide, nylon, PTFE, polystyrene, polyvinyl acetate, polyvinyl alcohol, and cellulosic powders. In one embodiment, particles included in a pore former can include an average size in the size range of from about 0.5 um to about 20 um. In one embodiment, particles included in a pore former can include an average size in the size range of from about 1.0 um to about 10 um.

When the binder is pyrolyzed it can undergo shrinkage that results both from a loss of mass and an increase in density. Because of local constraints within the system, the shrinkage opens up pores and cracks. Overall shrinkage and therefore average pore size can be controlled by adding or reducing an amount of filler used during pyrolysis. More filler results in less binder and thus less shrinkage within the system. The method as set forth in FIG. 1 in one embodiment can include controlling an average pore size of one or more preform ply of the plurality of preform plies, wherein the controlling an average pore size of the one or more preform ply includes adding or reducing an amount of filler used during a pyrolysis process for fabrication of the one or more preform ply.

In one embodiment, controlling an average pore size can include controlling a characteristic of the pore former as set forth herein. The pore former can define a species within a matrix that remains present through the consolidation process. During pyrolysis (or a separate heat treatment) the pore former can be removed. Removal can be, e.g., through a combustion process or through a charring (decomposition) process if a low char yield polymer is use. The pore former can leave behind a pore that is relatively free of residue that would interfere with CVI densification. Solid polymer particles can be used as pore formers (e.g., nylon). The pore former may not dissolve in the carrier and may not melt or deform considerably during the consolidation process so it can carry its shape and size into the pyrolysis process. Size and amount of a pore former in each preform ply can be changed in order to change the final average pore size and distribution in a preform ply and in a fabricated preform having a plurality of preform plies. The method as set forth in FIG. 1 can include in one embodiment controlling an average pore size of one or more preform ply of the plurality of preform plies, wherein the controlling an average pore size of the one or more preform ply includes controlling a characteristic of a pore former used during fabrication of the first preform ply.

Methods as set forth herein in one embodiment can include performance of infiltration in accordance with chemical vapor Infiltration (CVI). In any of the methods herein wherein performance of CVI is described, an alternative infiltration process can be substituted for CVI. In one embodiment, such alternative infiltration process can include melt infiltration such as reactive melt infiltration (RMI). In one embodiment, such alternative infiltration process can include direct melt oxidation (DIMOX). In one embodiment, such alternative infiltration process can include slurry infiltration. In one embodiment, such alternative infiltration process can include sol-gel infiltration. In one embodiment, such alternative infiltration process can include polymer infiltration. In one embodiment, such alternative infiltration process can include liquid silicon infiltration. In one embodiment, such alternative infiltration process can include a combined infiltration process.

Approximating language, as used herein throughout the specification and claims, can be applied to modify any quantitative representation that could permissibly vary without resulting in a change in the basic function to which it is related. Accordingly, a value modified by a term or terms, such as "about" is not to be limited to the precise value specified. The term "define" as set forth herein encompasses relationships where an element is partially defined as well as relationships where an element is entirely defined. In some instances, the approximating language can correspond to the precision of an instrument for measuring the value. Here and throughout the specification and claims, range limitations can be combined and/or interchanged; such ranges are identified and include all the sub-ranges contained therein unless context or language indicates otherwise. While the present disclosure has been described with reference to a number of specific embodiments, it will be understood that the true spirit and scope of the disclosure should be determined only with respect to claims that can be supported by the present specification. Further, while in numerous cases herein wherein systems and apparatuses and methods are described as having a certain number of elements it will be understood that such systems, apparatuses and methods can be practiced with fewer than or greater than the mentioned certain number of elements. Also, while a number of particular embodiments have been described, it will be understood that features and aspects that have been described with reference to each particular embodiment can be used with each remaining particularly described embodiment.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

What is claimed is:

1. A structure comprising:
a plurality of preform plies associated together to define a preform, wherein the plurality of preform plies include a binder, a carrier, a filler, and a pore former;
wherein a first preform ply and a second preform ply of the plurality of preform plies have different average pore sizes; and
wherein the preform comprises at least one of the following:
a) a solid structure, wherein the plurality of preform plies includes a center preform ply, a first set of preform plies from the center preform ply to a preform ply defining a first outer surface of the preform having increasing average pore sizes, and a second set of preform plies from the center preform ply to a preform ply defining a second outer surface of the preform having increasing average pore sizes, or
b) a hollow structure preform, wherein the plurality of preform plies of the preform define a sidewall of the hollow structure preform, wherein the plurality of preform plies includes a center preform ply, a first set of preform plies from the center preform ply to a preform ply defining an outer surface of the hollow structure preform having increasing average pore sizes, and a second set of preform plies from the center preform ply to a preform ply defining an inner surface of the hollow structure preform having decreasing average pore sizes, or
c) the preform is a hollow structure preform, wherein the plurality of preform plies of the preform define a sidewall of the hollow structure preform, wherein a certain preform ply of the plurality of preform plies that defines an inner surface of the hollow structure preform has a smallest average pore size of the plurality of preform plies, and wherein preform plies of the plurality of preform plies in a succession of locations from a location of the certain preform ply to a location of a preform ply that defines an outer surface of the hollow structure preform have increasing average pore sizes.

2. The structure of claim 1, wherein the second preform ply has a larger average pore size than the first preform ply.

3. The structure of claim 1, wherein the first preform ply is the center preform ply, the center preform ply has a first average pore size and the second preform ply has a second average pore size, the second average pore size being larger than the first average pore size.

4. The structure of claim 1, wherein the plurality of preform plies includes a third preform ply, wherein the second preform ply is disposed at a first side of the first preform ply, wherein the third preform ply is disposed at a second side of the first preform ply, and wherein the second preform ply and the third preform ply each have a larger average pore size than an average pore size of the first preform ply.

5. The structure of claim 1, wherein the center preform ply of the plurality of preform plies has a smallest average pore size of the plurality of preform plies, and wherein preform plies at successive locations from a location of the center preform ply to a location of a preform ply defining an outer surface of the preform have increasing average pore sizes.

6. The structure of claim 1, wherein the preform has a plurality of plies, each successive ply having larger average pore size than an innermost ply.

7. The structure of claim 1, wherein the preform is in a shape of a turbine component.

8. The structure of claim 1, wherein the preform is in a shape of a turbine component, and wherein the center preform ply of the plurality of preform plies has a smaller average pore size than one or more end ply of the plurality of preform plies that defines an outer surface of the preform.

9. The structure of claim 1, wherein a count of the plurality of preform plies is selected from the group consisting of more than 5 preform plies, more than 20 preform plies, more than 50 preform plies, and more than 100 preform plies.

10. The structure of claim 1, wherein the first preform ply includes fibers.

11. The structure of claim 10, wherein the fibers comprise silicon carbide.

12. The structure of claim 10, wherein the fibers include unidirectional fibers.

13. The structure of claim 10, wherein the fibers include woven fibers.

14. The structure of claim 10, wherein the fibers include a combination of unidirectional fibers and woven fibers.

15. The structure of claim 10, wherein a coating is formed on the fibers.

16. The structure of claim 15, wherein the coating is a matrix coating.

17. The structure of claim 15, wherein the coating comprises a material selected from the group consisting of SiC, BN, $B_4C$, $Si_3N_4$, $MoSi_2$, SiOC, SiNC and SiONC.

18. The structure of claim 15, wherein the coating is BN.

19. A structure comprising:
a plurality of preform plies defining a preform, the plurality of preform plies including a center preform ply, a first outer surface preform ply, and a second outer surface preform ply, wherein the plurality of preform plies include a binder, a carrier, a filler, and a pore former;
wherein the first outer surface preform ply has a first outer surface average pore size, the second outer surface preform ply has a second outer surface average pore size, and the center preform ply has a center average pore size;
wherein both the first outer surface average pore size and the second outer surface average pore size are greater than the center average pore size; and
wherein the plurality of preform plies further includes
a first set of preform plies extending from the center preform ply to the first outer surface preform ply; and
a second set of preform plies extending from the center preform ply to the second outer surface preform ply;
wherein the first set of preform plies and the second set of preform plies each have increasing average pore sizes from the center preform ply.

20. The structure of claim 19, wherein a count of the plurality of preform plies is selected from the group consisting of more than 5 preform plies, more than 20 preform plies, more than 50 preform plies, and more than 100 preform plies.

* * * * *